United States Patent
Chen et al.

(10) Patent No.: US 9,947,626 B2
(45) Date of Patent: *Apr. 17, 2018

(54) ELIMINATE SAWING-INDUCED PEELING THROUGH FORMING TRENCHES

(71) Applicant: Taiwan Semiconductor Manufacturing Company, Ltd., Hsinchu (TW)

(72) Inventors: Jie Chen, New Taipei (TW); Hsien-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/443,678

(22) Filed: Feb. 27, 2017

(65) Prior Publication Data

US 2017/0170128 A1 Jun. 15, 2017

Related U.S. Application Data

(63) Continuation of application No. 14/713,935, filed on May 15, 2015, now Pat. No. 9,589,903.

(Continued)

(51) Int. Cl.
  *H01L 23/544* (2006.01)
  *H01L 23/498* (2006.01)
  (Continued)

(52) U.S. Cl.
  CPC .......... *H01L 23/544* (2013.01); *H01L 21/561* (2013.01); *H01L 23/29* (2013.01); *H01L 23/3128* (2013.01); *H01L 23/49811* (2013.01); *H01L 23/49827* (2013.01); *H01L 24/09* (2013.01); *H01L 24/16* (2013.01); *H01L 24/19* (2013.01); *H01L 24/20* (2013.01); *H01L 24/32* (2013.01); *H01L 24/73* (2013.01);
  (Continued)

(58) Field of Classification Search
  CPC ....... H01L 23/544; H01L 23/29; H01L 24/09; H01L 23/49811; H01L 23/49827; H01L 2224/0237
  USPC ......................................................... 257/737
  See application file for complete search history.

(56) References Cited

U.S. PATENT DOCUMENTS 8,361,842 B2  1/2013  Yu et al.
8,680,647 B2  3/2014  Yu et al.
(Continued)

FOREIGN PATENT DOCUMENTS

KR     20130061037 A    6/2013

*Primary Examiner* — Fernando L Toledo
*Assistant Examiner* — Adam S Bowen
(74) *Attorney, Agent, or Firm* — Slater Matsil, LLP

(57) ABSTRACT

A package includes a device die, a molding material encircling the device die, wherein a top surface of the molding material is substantially level with a top surface of the device die, and a bottom dielectric layer over the device die and the molding material. A plurality of redistribution lines (RDLs) extends into the bottom dielectric layer and electrically coupling to the device die. A top polymer layer is over the bottom dielectric layer, with a trench ring penetrating through the top polymer layer. The trench ring is adjacent to edges of the package. The package further includes Under-Bump Metallurgies (UBMs) extending into the top polymer layer.

20 Claims, 23 Drawing Sheets

Related U.S. Application Data

(60) Provisional application No. 62/133,770, filed on Mar. 16, 2015.

(51) Int. Cl.
*H01L 23/00* (2006.01)
*H01L 23/29* (2006.01)
*H01L 23/31* (2006.01)
*H01L 21/56* (2006.01)
*H01L 25/10* (2006.01)
*H01L 25/00* (2006.01)
*H01L 25/065* (2006.01)
*H01L 23/538* (2006.01)

(52) U.S. Cl.
CPC .............. *H01L 24/83* (2013.01); *H01L 24/92* (2013.01); *H01L 24/97* (2013.01); *H01L 25/105* (2013.01); *H01L 25/50* (2013.01); H01L 23/5389 (2013.01); H01L 25/0657 (2013.01); H01L 2221/68318 (2013.01); H01L 2221/68345 (2013.01); H01L 2221/68359 (2013.01); H01L 2221/68381 (2013.01); H01L 2224/0237 (2013.01); H01L 2224/04105 (2013.01); H01L 2224/12105 (2013.01); H01L 2224/19 (2013.01); H01L 2224/32145 (2013.01); H01L 2224/32225 (2013.01); H01L 2224/48091 (2013.01); H01L 2224/48227 (2013.01); H01L 2224/73265 (2013.01); H01L 2224/73267 (2013.01); H01L 2224/92244 (2013.01); H01L 2224/97 (2013.01); H01L 2225/0651 (2013.01); H01L 2225/06568 (2013.01); H01L 2225/1023 (2013.01); H01L 2225/1035 (2013.01); H01L 2225/1041 (2013.01); H01L 2225/1058 (2013.01); H01L 2924/1431 (2013.01); H01L 2924/1434 (2013.01); H01L 2924/1436 (2013.01); H01L 2924/1437 (2013.01); H01L 2924/15311 (2013.01); H01L 2924/35121 (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,123,643 B2 | 9/2015 | Lin et al. |
| 2009/0115024 A1* | 5/2009 | Jeng ........................ H01L 23/562 257/620 |
| 2009/0321890 A1* | 12/2009 | Jeng ........................ H01L 21/78 257/620 |
| 2011/0221041 A1* | 9/2011 | Lin ........................ H01L 21/561 257/620 |
| 2011/0291288 A1* | 12/2011 | Wu ........................ H01L 23/49827 257/774 |
| 2012/0326324 A1* | 12/2012 | Lee ........................ H01L 25/105 257/774 |
| 2013/0001776 A1* | 1/2013 | Yu ........................ H01L 21/568 257/738 |
| 2013/0026468 A1* | 1/2013 | Yoshimuta ........... H01L 31/0236 257/49 |
| 2013/0062760 A1* | 3/2013 | Hung ........................ H01L 21/561 257/738 |
| 2013/0062761 A1* | 3/2013 | Lin ........................ H01L 23/49816 257/738 |
| 2013/0168848 A1* | 7/2013 | Lin ........................ H01L 24/19 257/737 |
| 2013/0307140 A1* | 11/2013 | Huang ........................ H01L 23/49827 257/737 |
| 2014/0203429 A1* | 7/2014 | Yu ........................ H01L 25/0652 257/737 |
| 2014/0225222 A1* | 8/2014 | Yu ........................ H01L 28/60 257/532 |
| 2014/0252646 A1* | 9/2014 | Hung ........................ H01L 23/481 257/774 |
| 2014/0262475 A1 | 9/2014 | Liu et al. |
| 2014/0264630 A1* | 9/2014 | Huang ........................ H01L 23/481 257/401 |
| 2014/0264930 A1 | 9/2014 | Yu et al. |
| 2015/0069623 A1* | 3/2015 | Tsai ........................ H01L 21/563 257/774 |

* cited by examiner

ELIMINATE SAWING-INDUCED PEELING THROUGH FORMING TRENCHES

PRIORITY CLAIM AND CROSS-REFERENCE

This application is a continuation of U.S. application Ser. No. 14/713,935 filed May 15, 2015, entitled "Eliminate Sawing-Induced Peeling Through Forming Trenches", which claims the benefit of U.S. Provisional Application No. 62/133,770 filed on Mar. 16, 2015, entitled "Eliminate Sawing-Induced Peeling Through Forming Trenches," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
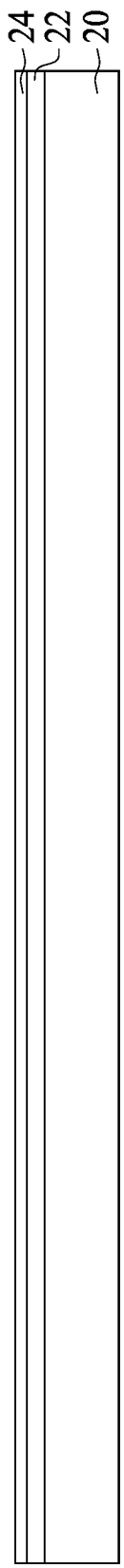
FIGS. 1 through 16 are cross-sectional views and top views of intermediate stages in the manufacturing of packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 23:
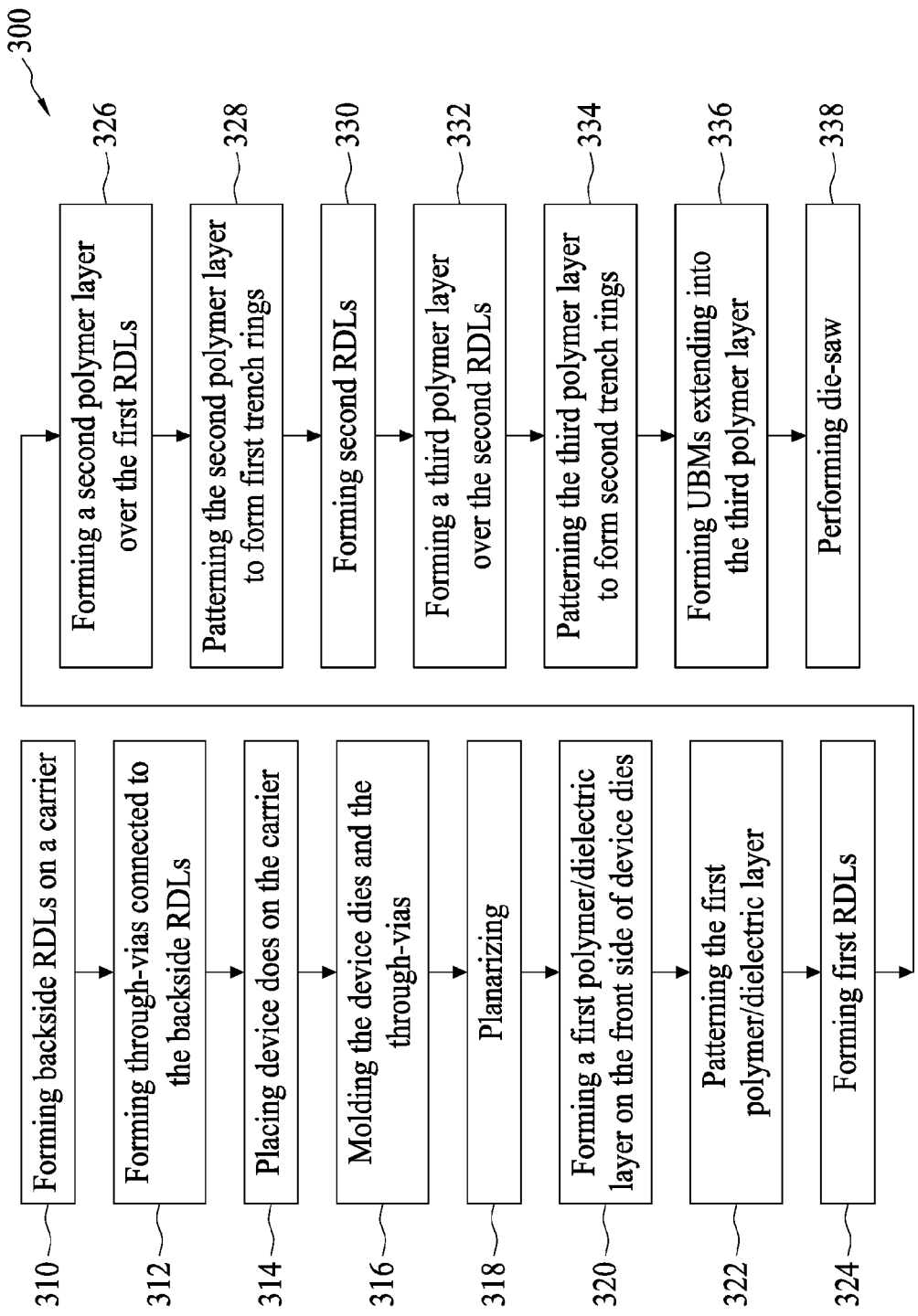
FIG. 23 illustrates a process flow in the formation of a package in accordance with some embodiments.

FIGS. 1 through 16 illustrate the cross-sectional views of intermediate stages in the formation a package in accordance with some embodiments. The steps shown in FIG. 1 through 16 are also illustrated schematically in the process flow 300 shown in FIG. 23. In the subsequent discussion, the process steps shown in FIGS. 1 through 16 are discussed referring to the process steps in FIG. 23.

FIG. 1 illustrates carrier 20 and release layer 22 formed on carrier 20. Carrier 20 may be a glass carrier, a ceramic carrier, or the like. Carrier 20 may have a round top-view shape and may have a size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In some embodiments, release layer 22 is formed of an epoxy-based thermal-release material. In other embodiments, release layer 22 is formed of an ultra-violet (UV) glue. Release layer 22 may be dispensed as a liquid and cured. In alternative embodiments, release layer 22 is a laminate film and is laminated onto carrier 20. The top surface of release layer 22 is leveled and has a high degree of co-planarity.

Dielectric layer 24 is formed on release layer 22. In accordance with some embodiments of the present disclosure, dielectric layer 24 is formed of a polymer, which may also be a photo-sensitive material such as polybenzoxazole (PBO), polyimid, or the like, that may be easily patterned using a photo lithography process. In alternative embodiments, dielectric layer 24 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 2:
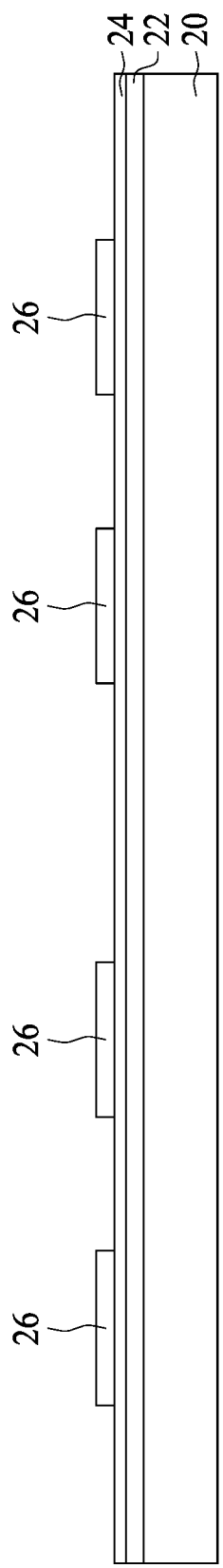
Figure 5:
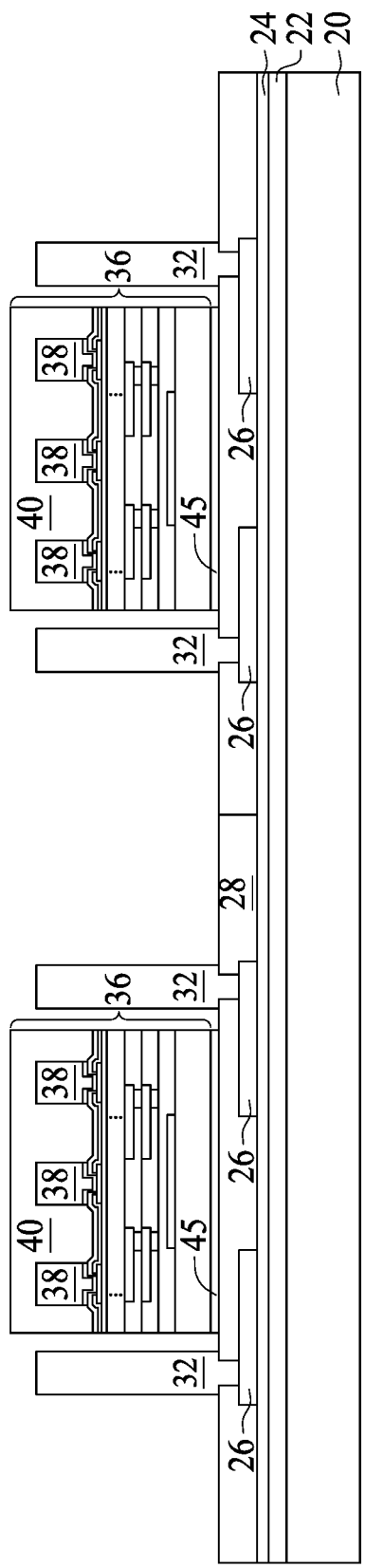

Referring to FIG. 2, Redistribution Lines (RDLs) 26 are formed over dielectric layer 24. The respective step is shown as step 310 in the process flow shown in FIG. 23. RDLs 26 are also referred to as backside RDLs since they are located on the backside of device die 36 (FIG. 5). The formation of RDLs 26 may include forming a seed layer (not shown) over dielectric layer 24, forming a patterned mask (not shown) such as a photo resist over the seed layer, and then performing a metal plating on the exposed seed layer. The patterned mask and the portions of the seed layer covered by the patterned mask are then removed, leaving RDLs 26 as in FIG. 2. In accordance with some embodiments, the seed layer comprises a titanium layer and a copper layer over the titanium layer. The seed layer may be formed using, for example, Physical Vapor Deposition (PVD). The plating may be performed using, for example, electro-less plating.

Figure 3:
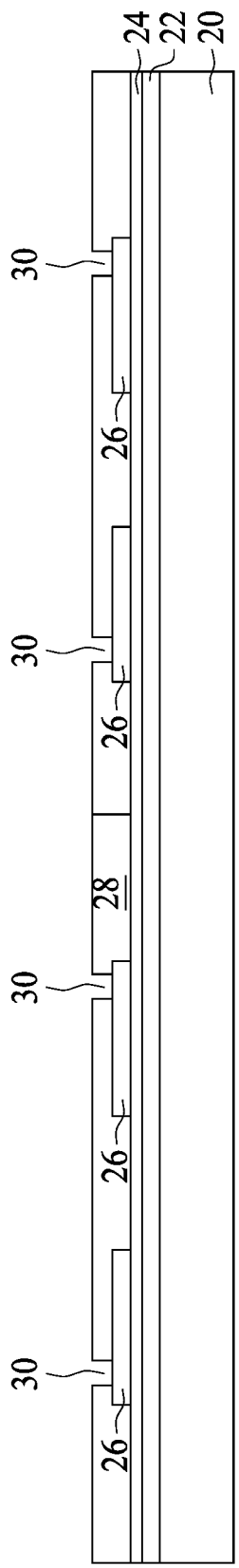

Referring to FIG. 3, dielectric layer 28 is formed on RDLs 26. The bottom surface of dielectric layer 28 is in contact with the top surfaces of RDLs 26 and dielectric layer 24. In accordance with some embodiments of the present disclosure, dielectric layer 28 is formed of a polymer, which may be a photo-sensitive polymer such as PBO, polyimide, or the like. In alternative embodiments, dielectric layer 28 is formed of a nitride such as silicon nitride, an oxide such as silicon oxide, PSG, BSG, BPSG, or the like. Dielectric layer 28 is then patterned to form openings 30 therein. Hence, RDLs 26 are exposed through the openings 30 in dielectric layer 28.

Figure 4:
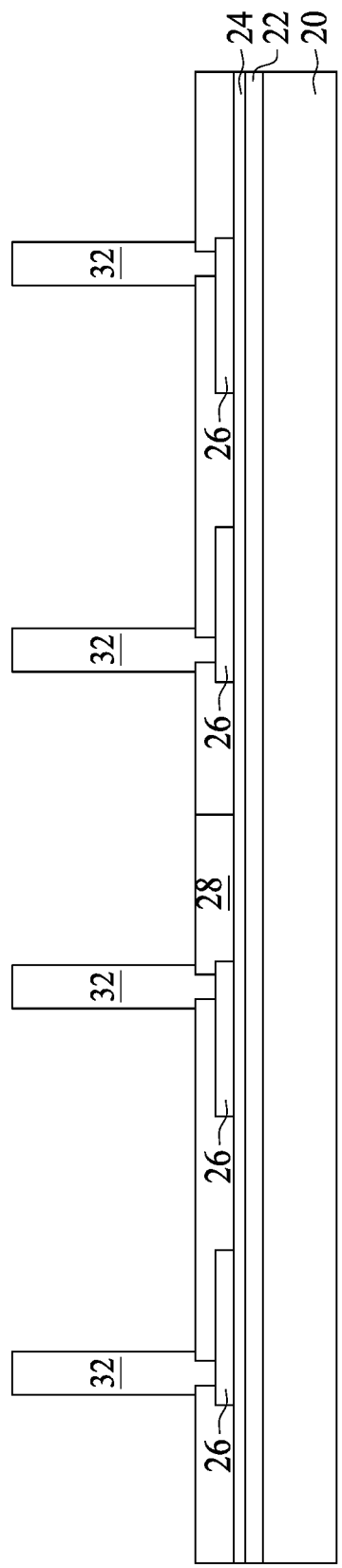

Referring to FIG. 4, metal posts 32 are formed. Throughout the description, metal posts 32 are alternatively referred to as through-vias 32 since metal posts 32 penetrate through the subsequently formed molding material. The respective step is shown as step 312 in the process flow shown in FIG. 23. In accordance with some embodiments of the present disclosure, through-vias 32 are formed by plating. The plating of through-vias 32 may include forming a blanket seed layer (not shown) over layer 28 and extending into openings 30 (FIG. 3), forming and patterning a photo resist (not shown), and plating through-vias 32 on the portions of the seed layer that are exposed through the openings in the photo resist. The photo resist and the portions of the seed layer that were covered by the photo resist are then removed. The material of through-vias 32 may include copper, aluminum, or the like. Through-vias 32 have the shape of rods. The top-view shapes of through-vias 32 may be circles, rectangles, squares, hexagons, or the like.

FIG. 5 illustrates the placement of device dies 36. The respective step is shown as step 314 in the process flow shown in FIG. 23. Device dies 36 are adhered to dielectric layer 28 through Die-Attach Films (DAFs) 45, which may be adhesive films. Device dies 36 may be logic device dies including logic transistors therein. In some exemplary embodiments, device dies 36 are designed for mobile applications and may be Power Management Integrated Circuit (PMIC) dies, Transceiver (TRX) dies, or the like.

In some exemplary embodiments, metal pillars 38 (such as a copper post) are pre-formed as the topmost portions of device dies 36, wherein metal pillars 38 are electrically coupled to the integrated circuit devices such as transistors in device dies 36. In accordance with some embodiments of the present disclosure, a polymer fills the gaps between neighboring metal pillars 38 to form top dielectric layer 40, wherein top dielectric layer 40 may also be on top of, and may or may not, contact the underlying passivation layers, which may comprise silicon nitride, silicon oxynitride, silicon oxide, or multi-layers thereof. Polymer layer 40 may be formed of PBO in accordance with some exemplary embodiments.

Figure 6:
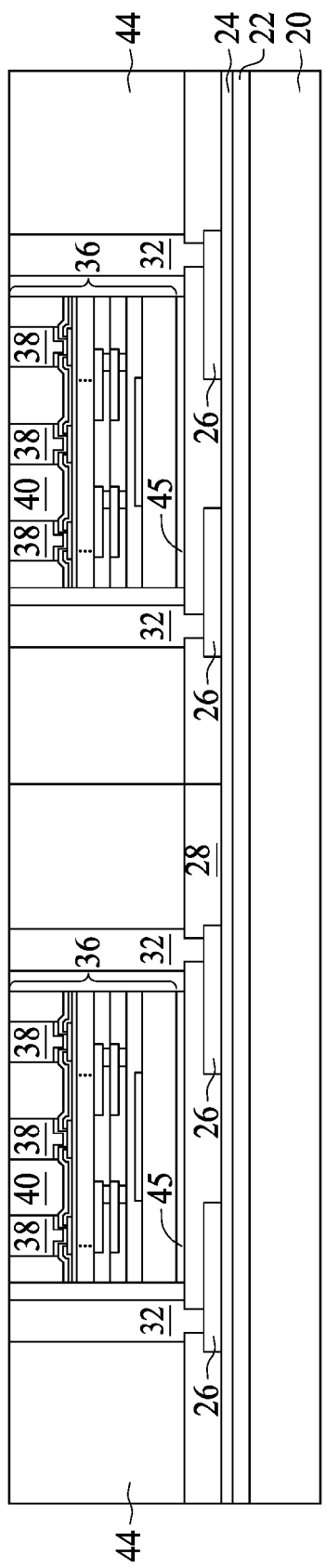

Next, as shown in FIG. 6, molding material 44 is molded on device die 36. The respective step is shown as step 316 in the process flow shown in FIG. 23. Molding material 44 fills the gaps between neighboring through-vias 32 and the gaps between through-vias 32 and device die 36. Molding material 44 may include a molding compound, a molding underfill, an epoxy, or a resin. The top surface of molding material 44 is higher than the top ends of metal pillar 38.

Further referring to FIG. 6, a planarization such as a Chemical Mechanical Polish (CMP) step or a grinding step is performed to thin molding material 44, until through-vias 32 and metal pillars 38 are exposed. The respective step is shown as step 318 in the process flow shown in FIG. 23. Due to the grinding, the top ends of through-vias 32 are substantially level (coplanar) with the top surfaces of metal pillars 38, and are substantially coplanar with the top surface of molding material 44.

Figure 7:
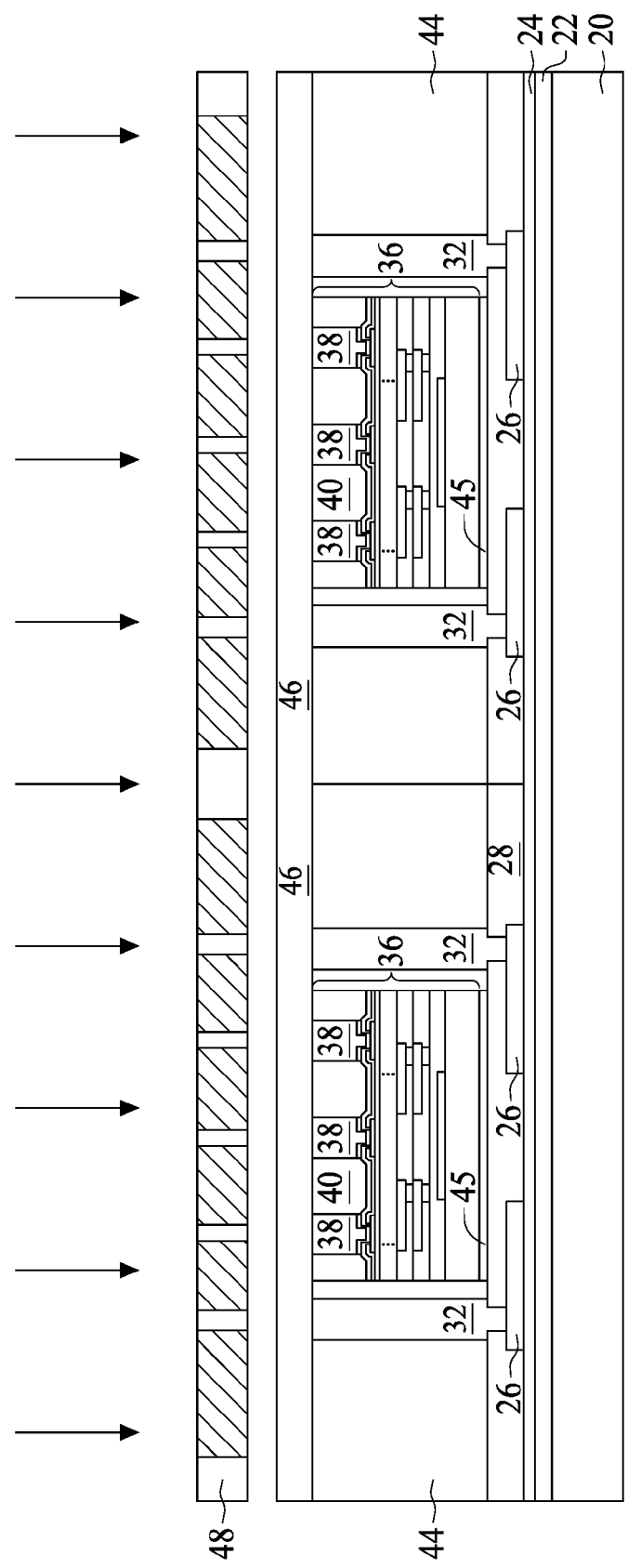

Referring to FIG. 7, dielectric layer 46 is formed. The respective step is shown as step 320 in the process flow shown in FIG. 23. In accordance with some embodiments of the present disclosure, dielectric layer 46 is formed of a polymer, which may also be a photo sensitive dielectric material in accordance with some embodiments of the present disclosure. For example, dielectric layer 46 may be formed of PBO, polyimide, or the like. In alternative embodiments, dielectric layer 46 is formed of silicon nitride, silicon oxide, or the like. Throughout the description, dielectric layer 46 is alternatively referred to as a bottom RDL-embedding polymer layer.

Referring to FIG. 7, dielectric layer 46 is patterned in a photo lithography process. The respective step is shown as step 322 in the process flow shown in FIG. 23. For example, in the embodiments in which dielectric layer 46 is formed of a photo sensitive material, photo lithography mask 48 is used for light exposure. Photo lithography mask 48 includes transparent portions allowing light to pass through, and opaque portions for blocking light. A light exposure is then performed, wherein light (arrows) is projected to expose light-sensitive dielectric layer 46. After the development and the baking process, openings 50 are formed, as shown in FIG. 8.

Figure 8:
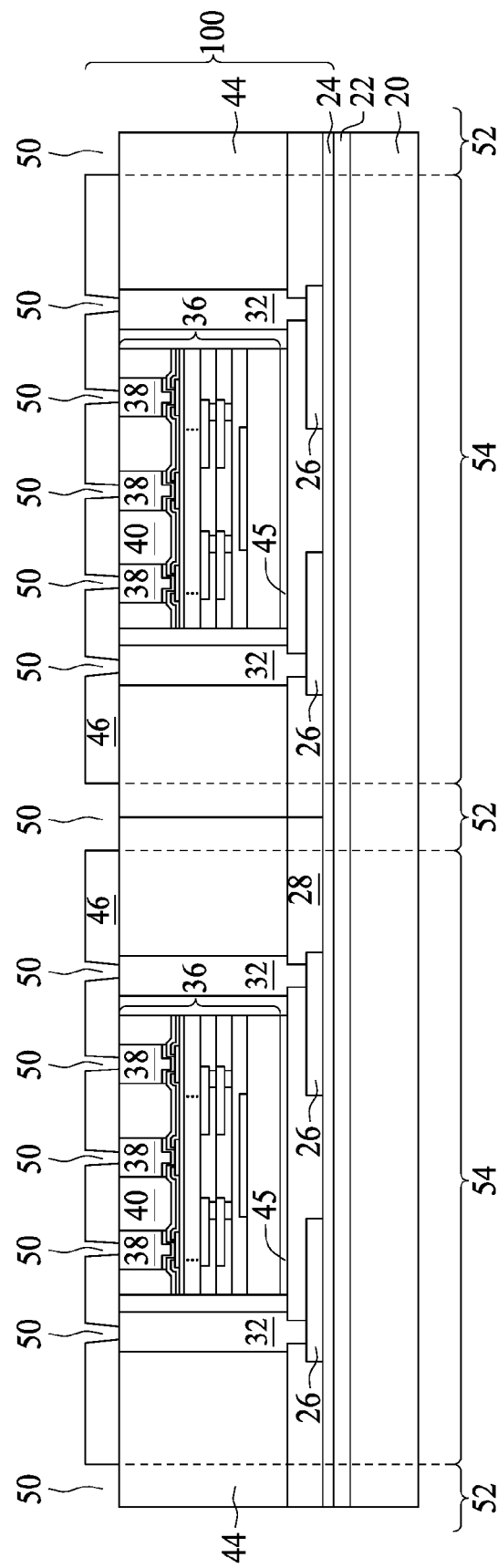

As shown in FIG. 8, through-vias 32 and metal pillars 38 are exposed through openings 50. In subsequent paragraphs, the portions of the structure over release layer 22, including dies 36, through-vias 32, and the corresponding RDLs (with some being formed in subsequent steps), etc., are in combination referred to as package 100, which includes a plurality of packages 54. In addition, scribe lines 52 are between packages 52, and the edges of the bottom RDL-embedding polymer layer 46 define the boundaries of packages 54. Scribe lines 52 are the regions in which the sawing blade will pass through in a subsequent die-sawing process. Accordingly, RDL-embedding polymer layer 46 does not extend into scribe lines 52, but will be in packages 54. As a result of the patterning, in scribe lines 52, molding material 44 is exposed.

Figure 21:
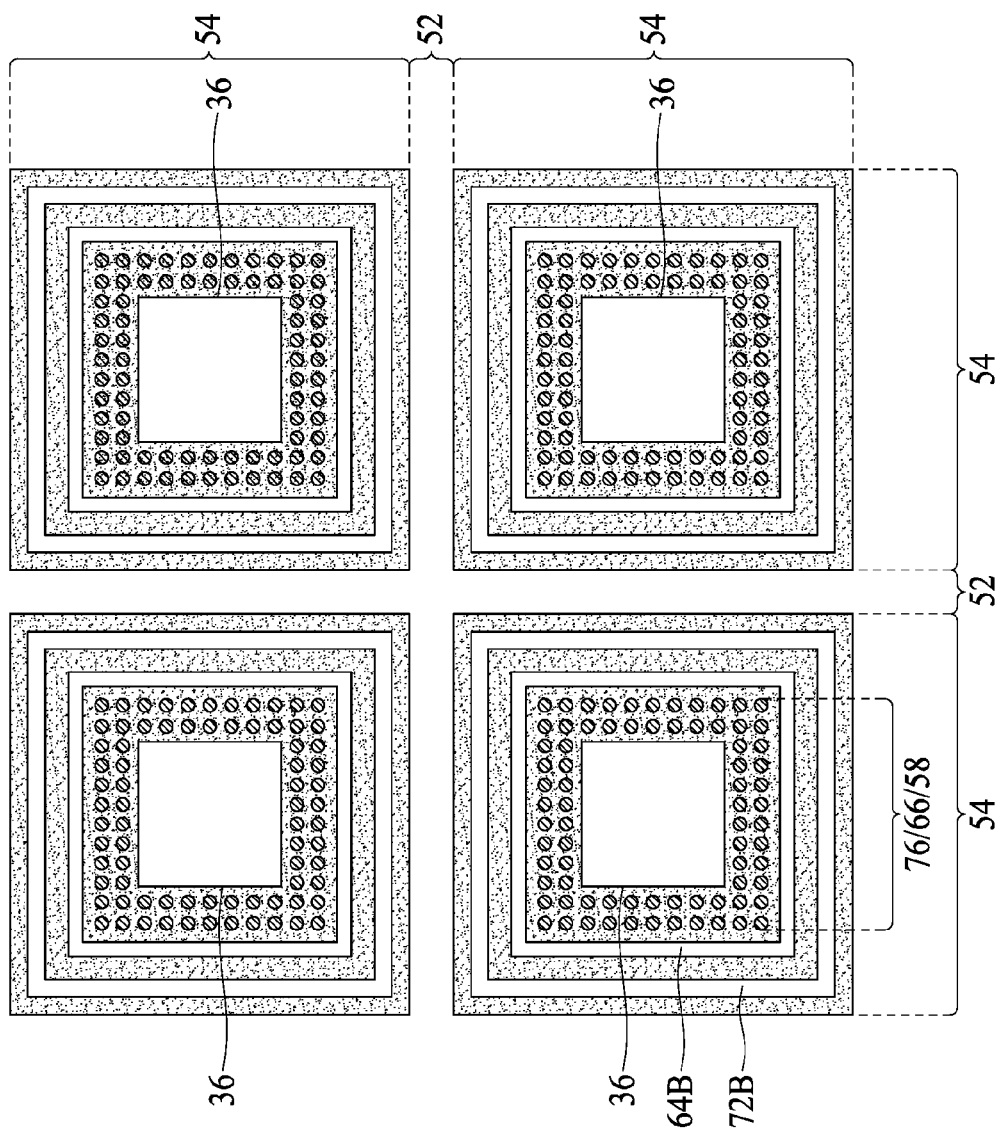
FIG. 21 illustrates a top-view of packages in accordance with some embodiments.

FIG. 21 illustrates a top view of packages 54 and scribe lines 52. As shown in FIG. 21, scribe lines 52 form a grid pattern to separate packages 54.

Figure 9:
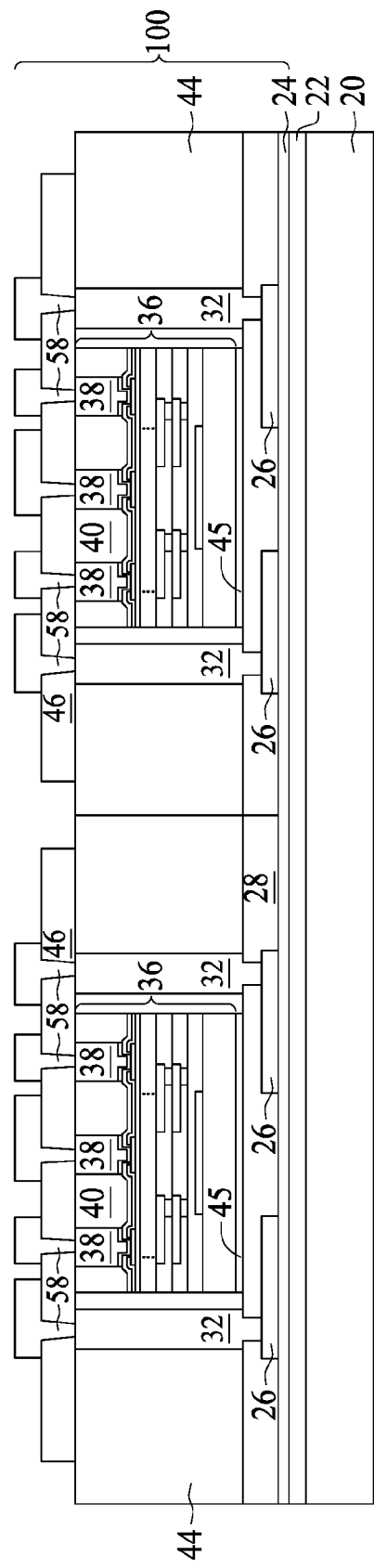

Next, referring to FIG. 9, Redistribution Lines (RDLs) 58 are formed to connect to metal pillar 38 and through-vias 32. The respective step is shown as step 324 in the process flow shown in FIG. 23. RDLs 58 may also interconnect metal pillar 38 and through-vias 32. RDLs 58 include metal traces (metal lines) over dielectric layer 46 as well as vias extending into openings 50 (FIG. 8) to electrically connect to through-vias 32 and metal pillar 38. In accordance with some embodiments of the present disclosure, RDLs 58 are formed in a plating process, wherein each of RDLs 58 includes a seed layer (not shown) and a plated metallic material over the seed layer. The seed layer and the plated material may be formed of the same material or different materials. RDLs 58 may comprise a metal or a metal alloy including aluminum, copper, tungsten, and alloys thereof. After the formation of RDLs 58, the openings 50 (FIG. 8) in scribe lines 52 remain not filled with RDLs 58.

Figure 10:
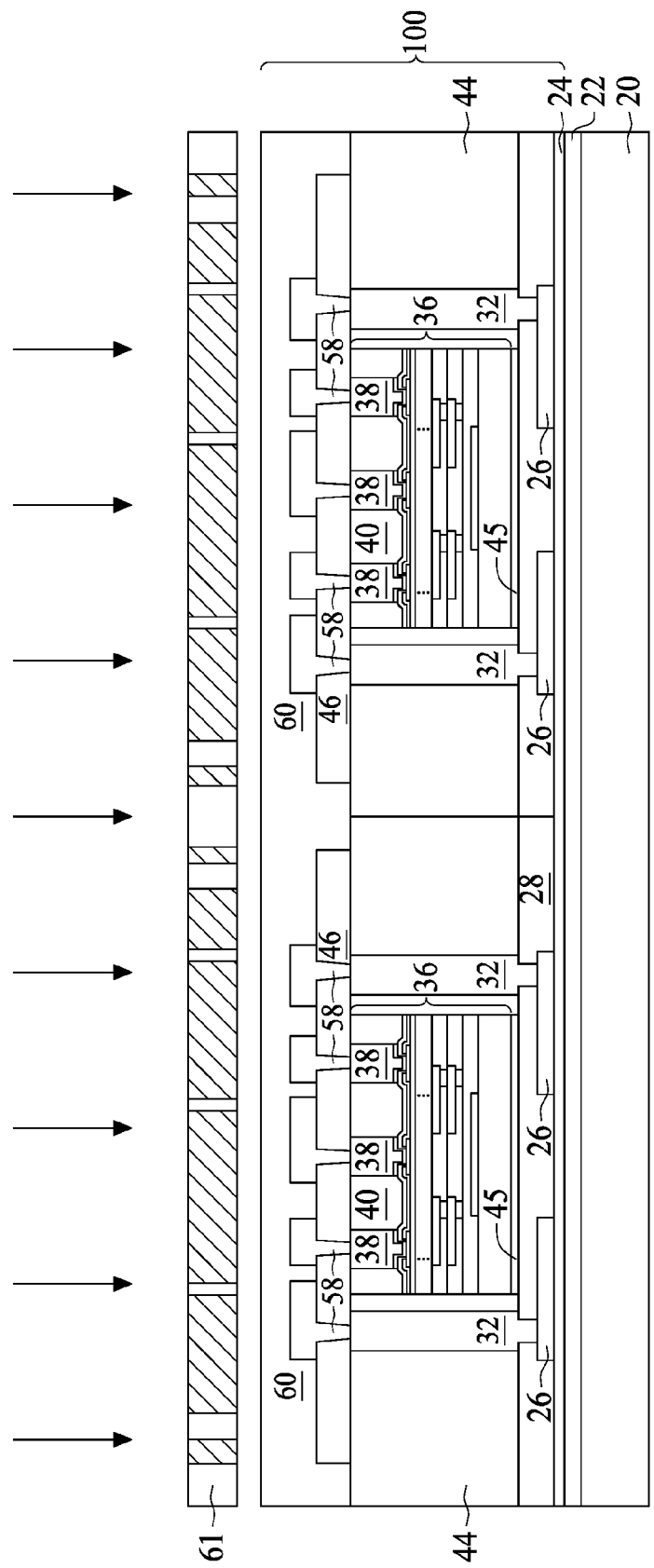

Referring to FIG. 10, polymer layer 60 is formed over RDLs 58 and dielectric layer 46, for example, through spin coating. The respective step is shown as step 326 in the process flow shown in FIG. 23. Polymer layer 60 may be formed using a polymer selected from the same candidate materials as those of dielectric layer 46. For example, polymer layer 60 may comprise PBO, polyimide, or the like. After the formation, polymer 60 fills openings 50 (FIG. 9) that are in scribe lines 52, and covers RDLs 58.

Figure 11:
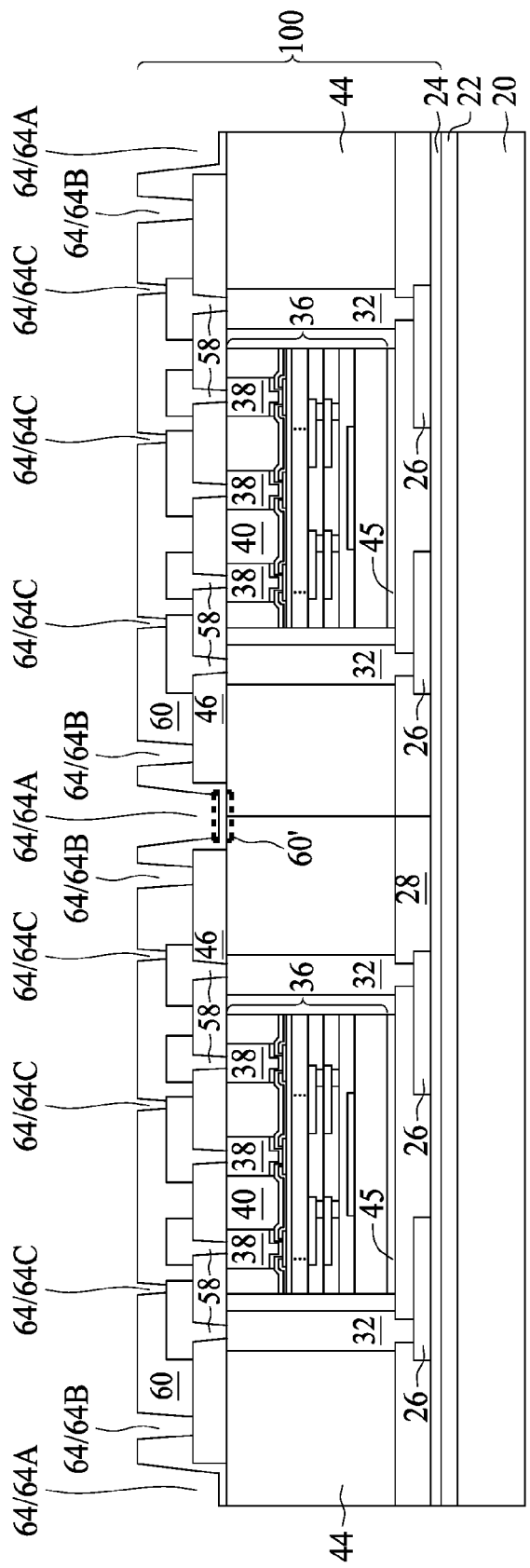

Next, as also shown in FIG. 10, photo lithography mask 61 is placed over composite package 100. A light exposure is then performed, wherein light (arrows) is projected to expose polymer layer 60. After the development and the baking process, openings 64 (including 64A, 64B, and 64C) are formed, as shown in FIG. 11. The respective step is shown as step 328 in the process flow shown in FIG. 23. The pad portions of RDLs 58 are exposed through openings 64C, which are discrete openings in packages 54. Openings 64B are also in packages 54, and extend from the top surface of polymer layer 60 to the top surface of dielectric/polymer layer 46, and hence dielectric layer 46 is exposed through openings 64B. In accordance with some embodiments, as shown in FIG. 21, openings 64B form trench rings close to scribe lines 52, for example, with the distance between openings 64B and the respective scribe lines 52 being smaller than about 100 μm. Furthermore, openings 64B may be formed to encircle, and hence does not overlap, the respective dies 36 and the conductive features in the respective packages 54. Alternatively stated, dies 36 and the conductive features do not extending directly underlying trench rings 64B in accordance with some embodiments of the present disclosure, and are limited in the region encircled by trench rings 64B.

As shown in FIG. 11, the portions of polymer 60 in scribe lines 52 are much thicker than the portions of polymer 60 in packages 54. As a result, in the lithography process to pattern polymer 60, residue 60' may be left after the patterning due to inadequate light exposure of the bottom portions of polymer 60 in scribe lines 52. It is also possible that there is no residue of polymer 60 left in scribe lines 52. It is appreciated that whether residue 60' is left or not is affected by various factors including the thicknesses and the materials of layers 46 and 60, the exposure conditions, and the like.

Figure 12:
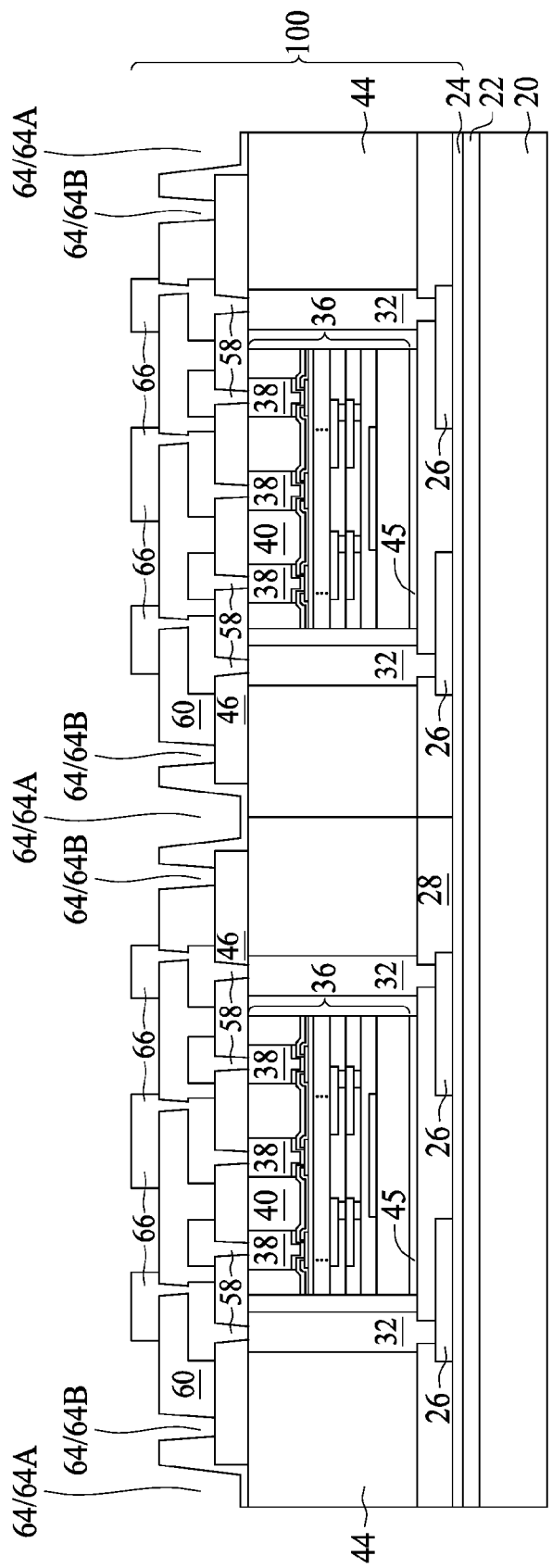

Next, referring to FIG. 12, RDLs 66 are formed to connect to RDLs 58. The respective step is shown as step 330 in the process flow shown in FIG. 23. RDLs 66 also include metal traces (metal lines) over polymer layer 60 as well as vias extending into openings 64C (FIG. 11) to electrically connect to RDLs 58. The material and the formation process of RDLs 66 may be similar to that of RDLs 58. Trench rings 64B and scribe lines 52 remain not filled with RDLs 66.

Figure 13:
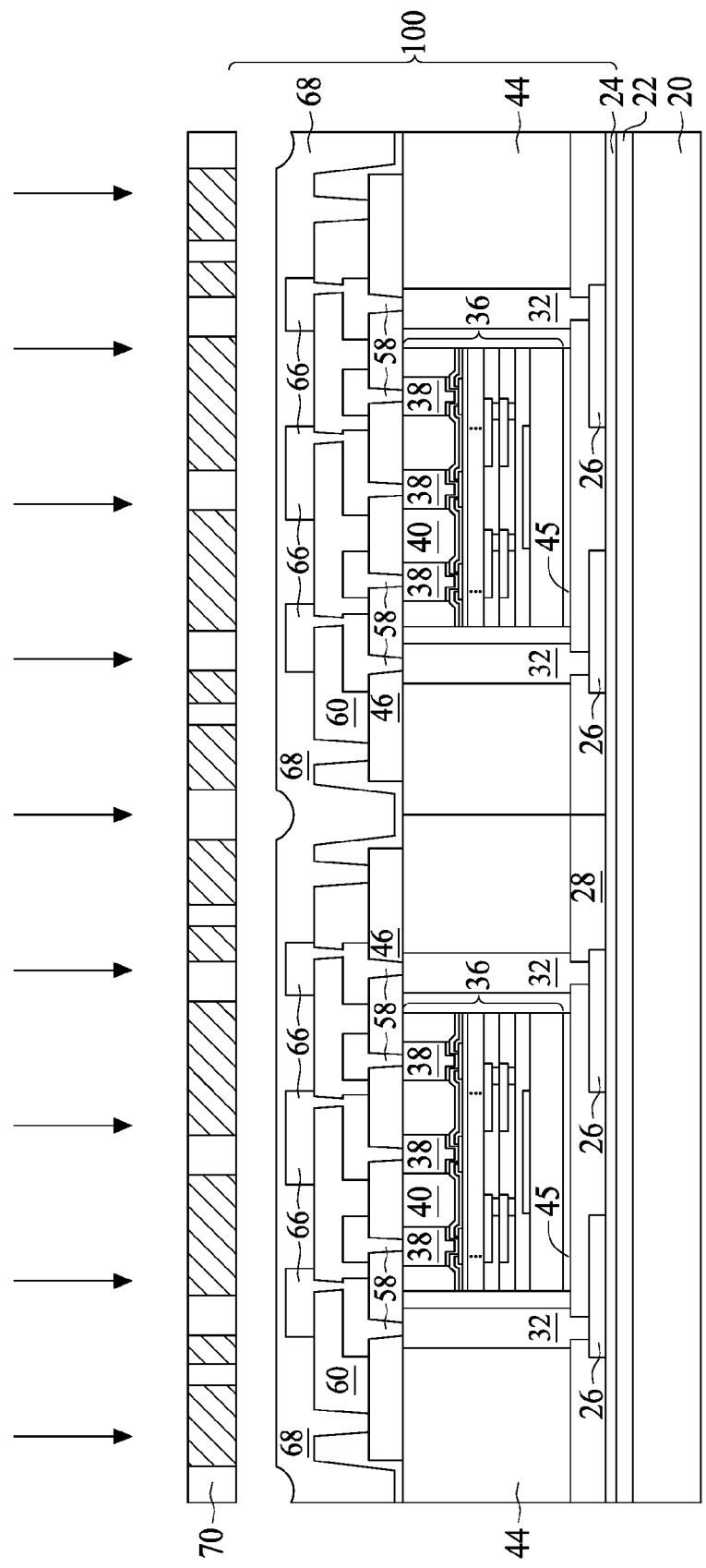

Referring to FIG. 13, polymer layer 68 is formed over RDLs 66, for example, through spin coating. The respective step is shown as step 332 in the process flow shown in FIG. 23. Polymer layer 68 is referred to as a top polymer layer hereinafter. Although the illustrated exemplary embodiments show three dielectric (polymer) layers and the corresponding RDLs, the number of layers may be more or fewer than illustrated in other embodiments. Polymer layer 68 may also be formed using a polymer selected from the same candidate materials as those of dielectric layer 46. For example, polymer layer 68 may comprise PBO, polyimide, or the like. After the formation, polymer layer 68 fills openings 64A and 64B (FIG. 12), and covers RDLs 66.

Figure 14:
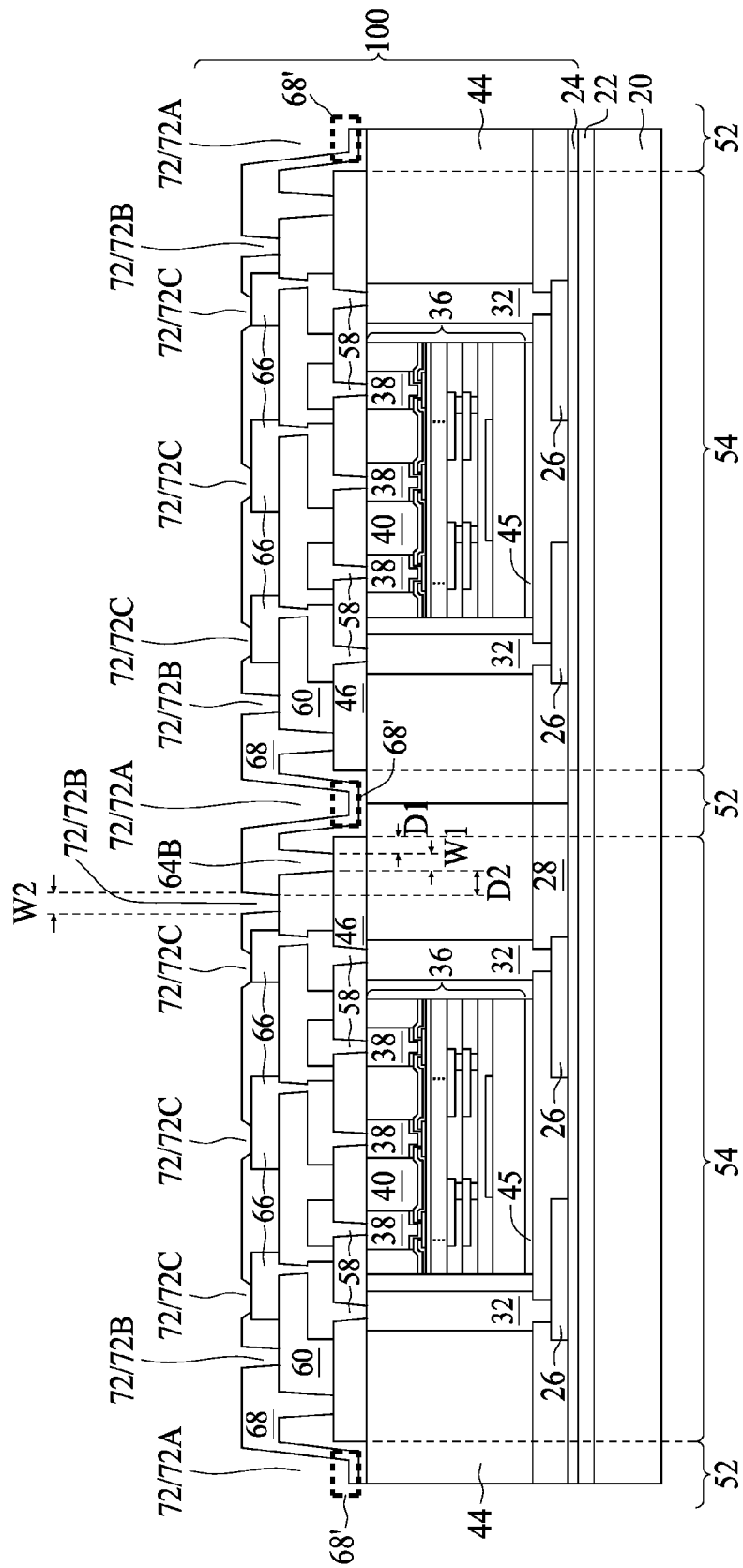

Next, as also shown in FIG. 13, polymer layer 68 is patterned. The respective step is shown as step 334 in the process flow shown in FIG. 23. Photo lithography mask 70 is placed over composite package 100. A light exposure is then performed, wherein light (arrows) is projected to expose polymer layer 68. After the development and the baking process, openings 72 (including 72A, 72B, and 72C) are formed, as shown in FIG. 14. The pad portions of RDLs 66 are exposed through openings 72C, which are discrete openings in packages 54. Openings 72B are also in packages 54, and extend from the top surface of polymer layer 68 to the top surface of polymer layer 60, and hence polymer layer 60 is exposed through openings 72B. In accordance with some embodiments, openings 72B form trench rings close to scribe lines 52 (also refer to FIG. 22). Furthermore, openings 72B may be formed to encircle, and hence does not overlap, the respective dies 36 and the conductive features in the respective packages 54. Alternatively stated, dies 36 and the conductive features in packages 54 do not extending directly underlying trench rings 72B in accordance with some embodiments of the present disclosure, and are limited in the region encircled by trench rings 72B. In some exemplary embodiments, as shown in FIG. 14, trench ring 72B is formed on the inner side of trench ring 64B (which is filled by polymer layer 68).

As shown in FIG. 13, the portions of polymer 68 in scribe lines 52 are much thicker than the portions of polymer 60 in packages 54. As a result, after the lithography process to pattern polymer 60, as shown in FIG. 14, residue portions 68' (FIG. 14) are left in scribe lines 52. The thickness of residue portions 68' may be greater than, equal to, or smaller than the thickness of the portion of polymer layer 68 in packages 54.

In accordance with some exemplary embodiments, trench ring 64B has distance D1 from the closest scribe line 52. Distance D1 may be greater than about 10 μm, and may be smaller than about 50 μm. The width W1 of trench ring 64B may be greater than about 10 μm and smaller than about 50 μm. Distance D2 between trench ring 64B and trench ring 72B may be in the range between about 10 μm and about 50 μm. Width W2 of trench ring 72B may also be in the range between about 10 μm and about 50 μm.

Figure 15:
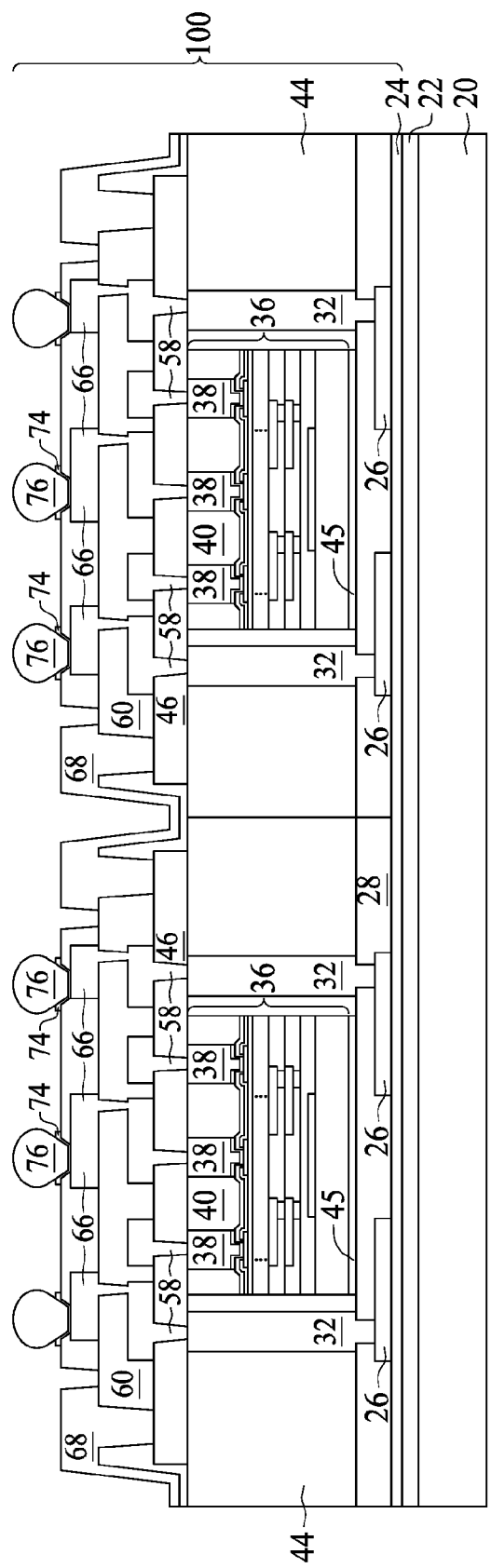

FIG. 15 illustrates the formation of Under-Bump Metallurgies (UBMs) 74 and electrical connectors 76 in accordance with some exemplary embodiments. The respective step is shown as step 336 in the process flow shown in FIG. 23. The formation of UBMs 74 may include deposition and patterning. The formation of electrical connectors 76 may include placing solder balls on the exposed portions of UBMs 74 and then reflowing the solder balls. In alternative embodiments, the formation of electrical connectors 76 includes performing a plating step to form solder regions over RDLs 66 and then reflowing the solder regions. Electrical connectors 76 may also include metal pillars or metal pillars and solder caps, which may also be formed through plating.

Next, package 100 is de-bonded from carrier 20. The de-bonding may be performed by projecting a light such as UV light or laser on release layer 22 to decompose release layer 22. In the de-bonding, a tape (not shown) may be adhered onto polymer layer 68 and electrical connectors 76. In subsequent steps, carrier 20 and release layer 22 are removed from package 100. The resulting structure is shown in FIG. 16.

Figure 16:
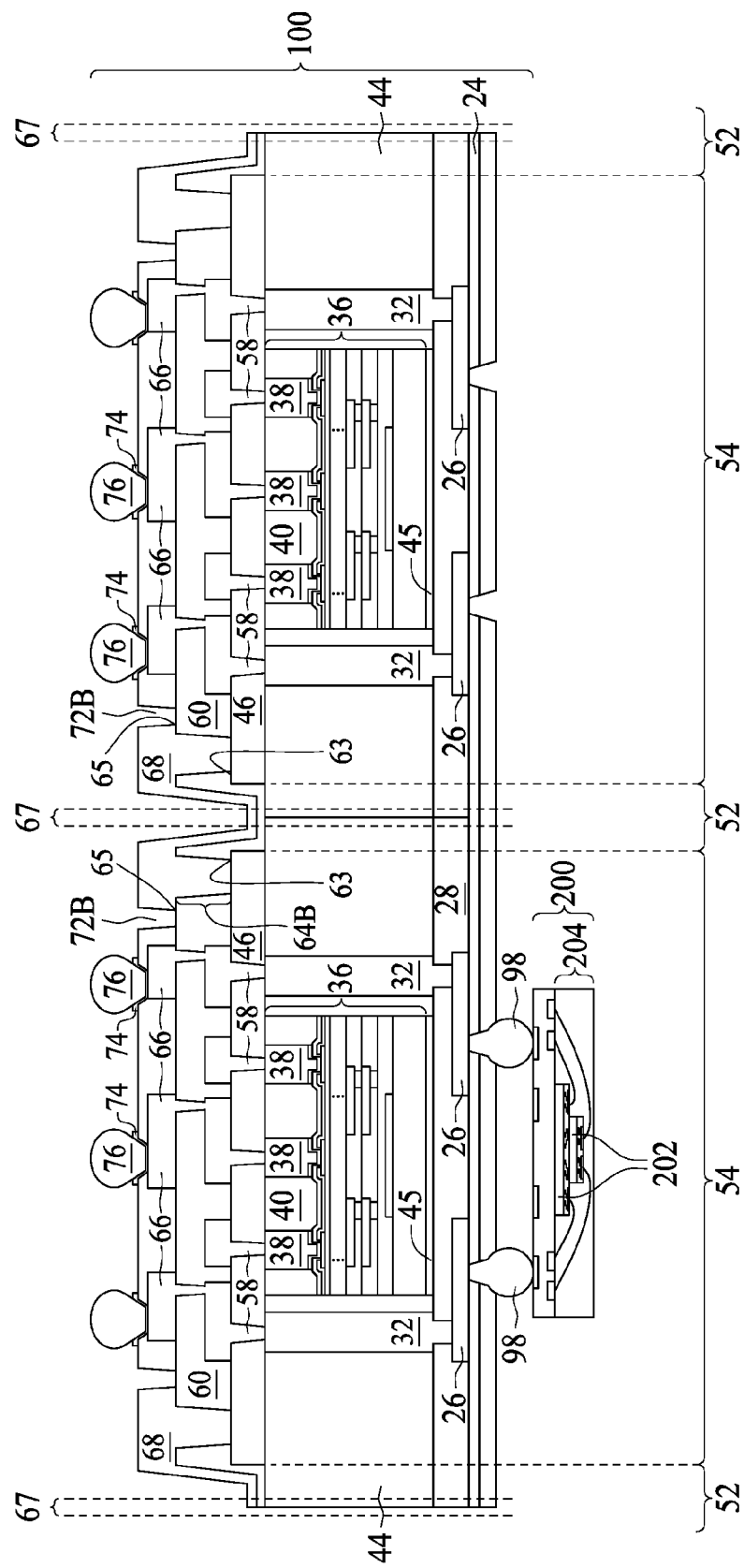
Figure 22:
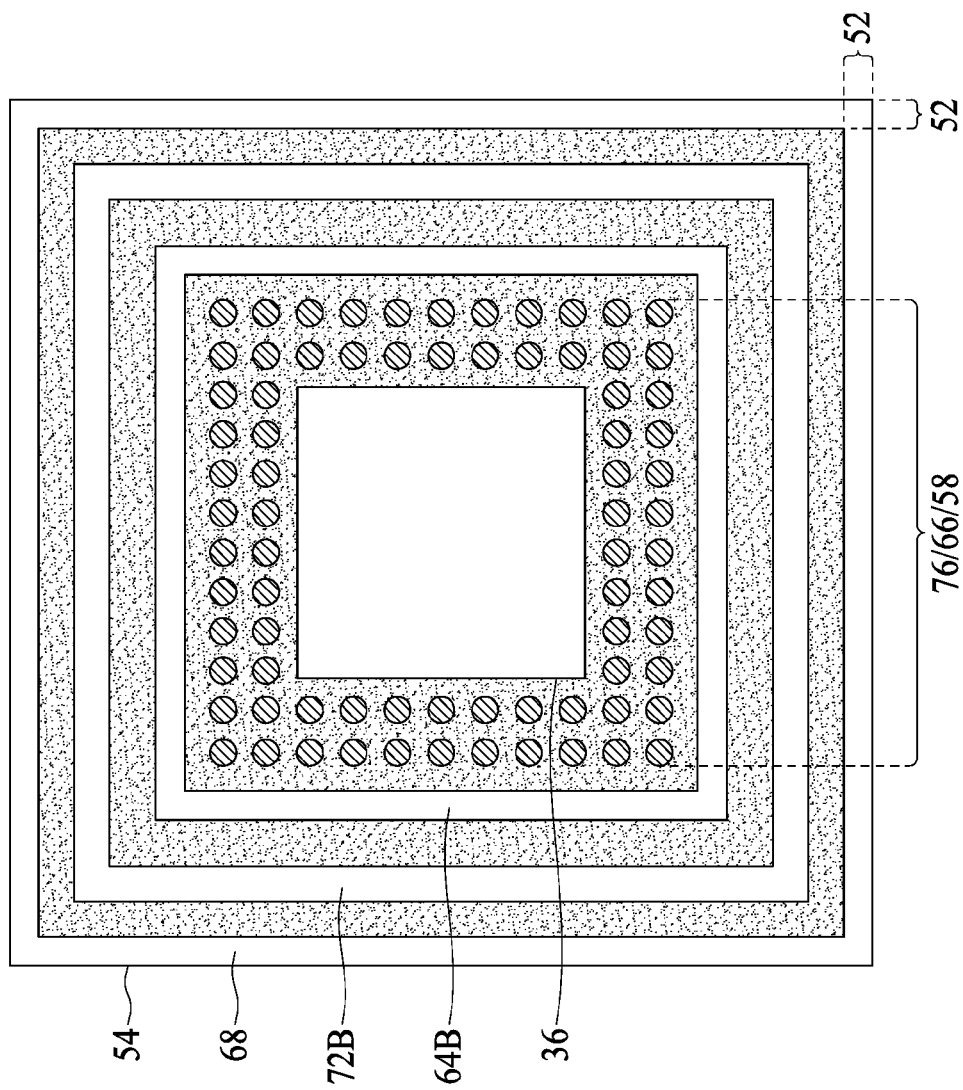
FIG. 22 illustrates a top-view of a sawed package in accordance with some embodiments.

As shown in FIG. 16, a die saw step is performed to saw package 100 into a plurality of packages 54, each including device die 22 and through-vias 32. The paths passed through by the sawing blade are marked as paths 67. The respective step is shown as step 338 in the process flow shown in FIG. 23. FIG. 22 illustrates a top view of one of packages 54 sawed from package 100. It is appreciated that since the width of the sawing blade is typically smaller than the widths of scribe lines 52 as shown in FIG. 15, the resulting package 54 may include small portions of the original scribe lines 52.

Referring to FIG. 16 again, in the sawing of package 100, due to the residues in scribe lines, neighboring dielectric/polymer layers 46, 60, and/or 68 may be sawed-through. Since the interface between neighboring dielectric/polymer layers 46, 60, and 68 and molding material 44 are weak parts, the upper ones of dielectric/polymer layers 46, 60, and 68 may delaminate from the underlying ones of dielectric/polymer layers 46, 60, and 68 and molding material 44. The delamination tends to propagate through the interfaces into packages 54. By forming trench rings 64B and 72B, if delamination occurs, the delamination will be stopped by the trench rings. For example, assuming delamination occurs at, and propagates through, the interface between polymer layers 46 and 60, the delamination will end at the position marked as 63, which are also rings. If delamination occurs at, and propagate through, the interface between polymer layers 60 and 68, the delamination will end at the position marked as 65, which are also rings.

FIG. 16 also illustrates the bonding of package 54 with another package 200. In accordance with some embodiments of the present disclosure, the bonding is performed through solder regions 98, which join the metal pad portions of RDLs 26 to the metal pads in package 200. In accordance with some embodiments of the present disclosure, package 200 includes device dies 202, which may be memory dies such as Static Random Access Memory (SRAM) dies, Dynamic Random Access Memory (DRAM) dies, or the like. The memory dies may also be bonded to package substrate 204 in some exemplary embodiments.

FIG. 21 illustrates a top view of package 100 and scribe lines 52. As shown in FIG. 21, trench ring 72B forms a ring that encircles device die 36, electrical connectors 76 and RDLs 58 and 66. Trench ring 64B also forms a ring. In accordance with some embodiments of the present disclosure, as shown in FIG. 21, trench ring 72B encircles trench ring 64B. In alternative embodiments (not shown), trench ring 72B may be encircled by trench ring 64B. The package 54 obtained after sawing package 100 is illustrated in FIG. 22.

Figure 17:
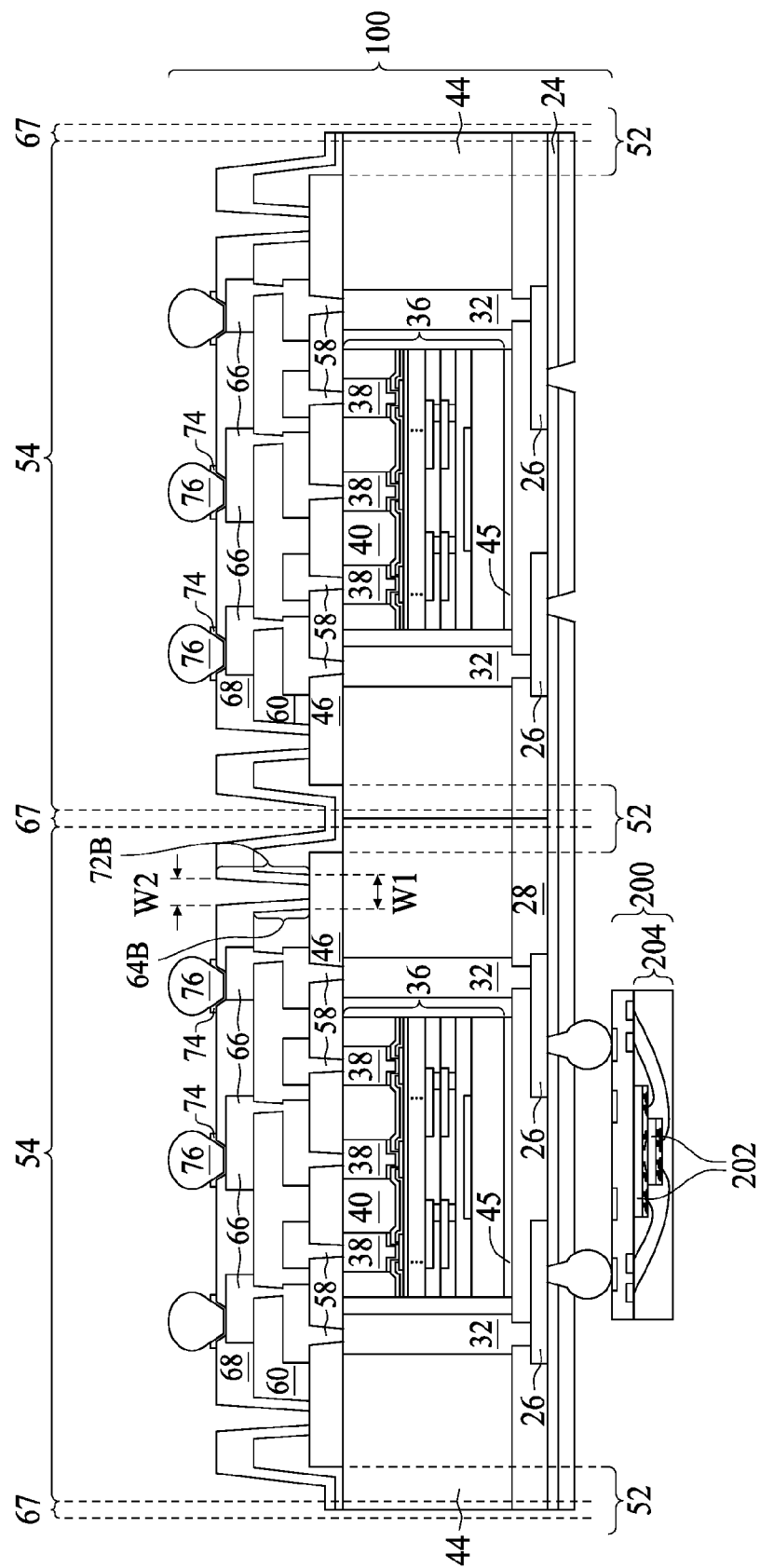
FIGS. 17 through 20 are cross-sectional views of packages in accordance with alternative embodiments.

FIGS. 17 through 20 illustrate the cross-sectional views of package 100 (and packages 54 therein) in accordance with alternative embodiments. In each of FIGS. 17 through 20, trenches 64B and 72B may form full rings close to the respective edges of the packages. As shown in FIG. 17, trench ring 64B and trench ring 72B overlap with each other, with the width W2 of trench ring 72B being smaller than width W1 of trench ring 64B. Accordingly, trench ring 72B extends into the portion of polymer layer 68 that extends into trench ring 64B.

Figure 18:
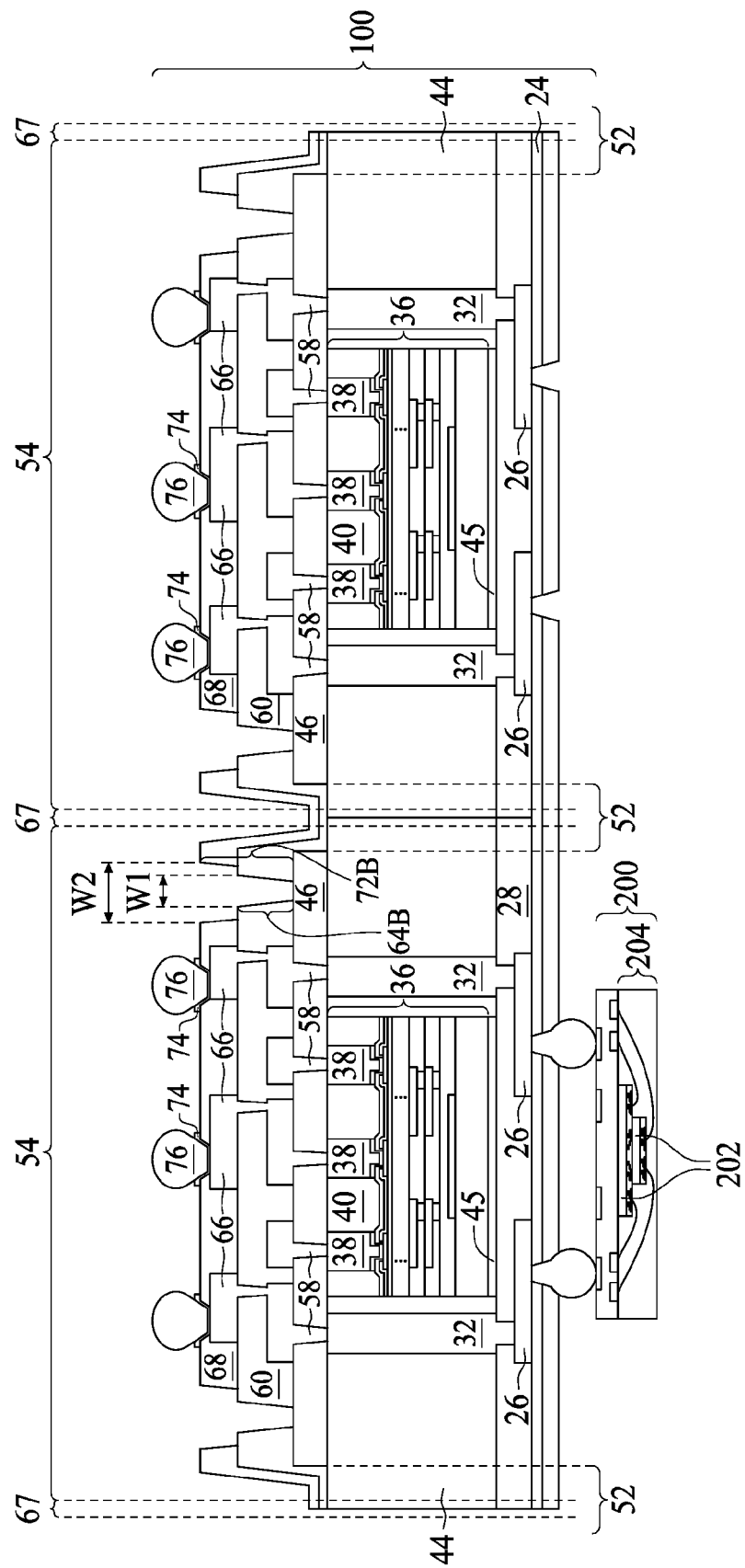

FIG. 18 illustrates the cross-sectional views of package 100 (and packages 54 therein) in accordance with alternative embodiments. In these embodiments, trench ring 64B and trench ring 72B also overlap with each other, with the width W2 of trench ring 72B being greater than width W1 of trench ring 64B. Accordingly, polymer layer 68 does not extend into trench ring 64B. Trench rings 64B and 72B in these embodiments are merged as a large trench ring.

Figure 19:
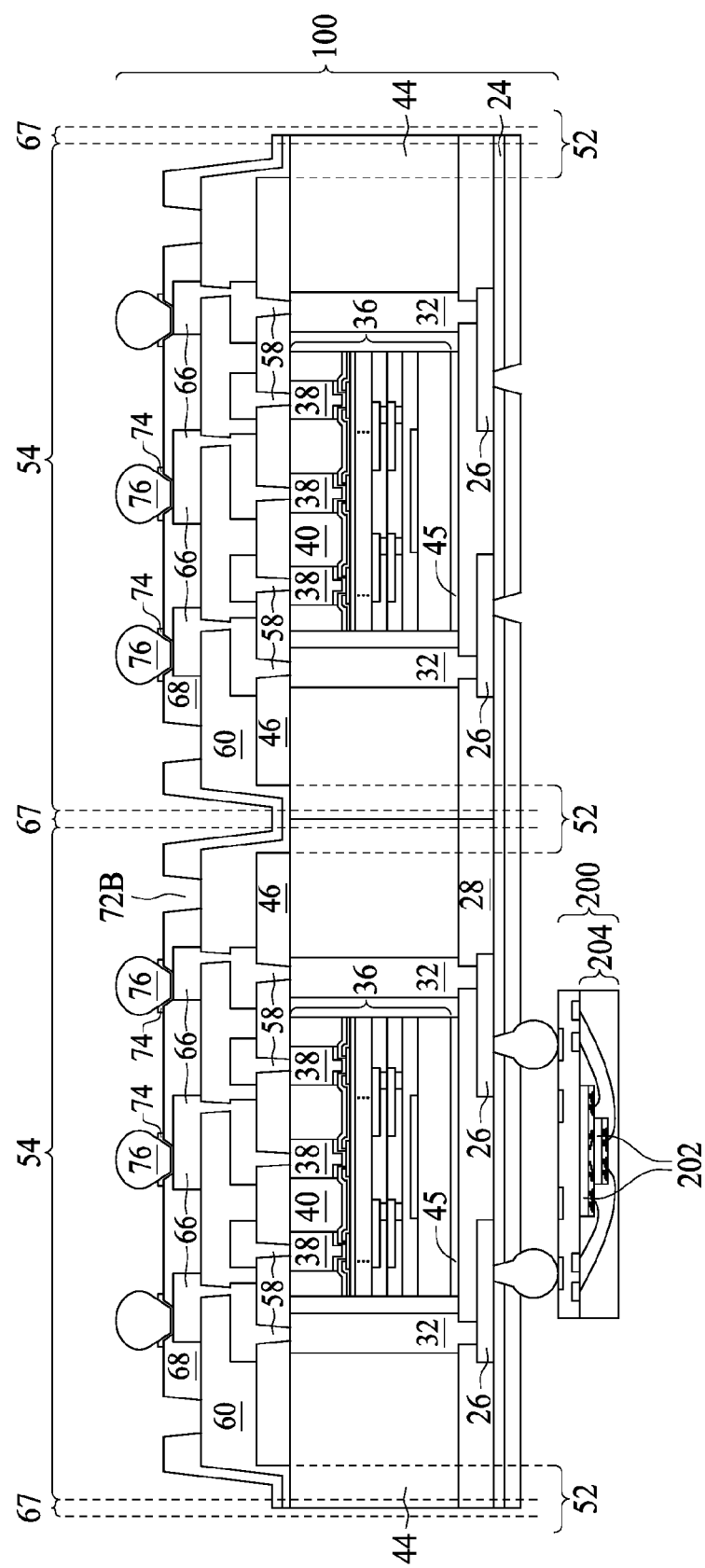

FIG. 19 illustrates the cross-sectional views of package 100 (and packages 54 therein) in accordance with alternative embodiments. In these embodiments, there is no trench ring formed in polymer layer 60. These embodiments may be used when no residue portions of polymer layer 60 are left in scribe lines 52 after the step shown in FIG. 11, and hence it is not necessary to form a trench ring in polymer layer 60. However, with more polymer layers formed, the trenches in scribe lines 52 become increasingly deeper, and hence upper polymer layers such as polymer layer 68 are more likely to have residue portions. Trench ring 72B is thus formed in polymer layer 68 in these embodiments.

Figure 20:
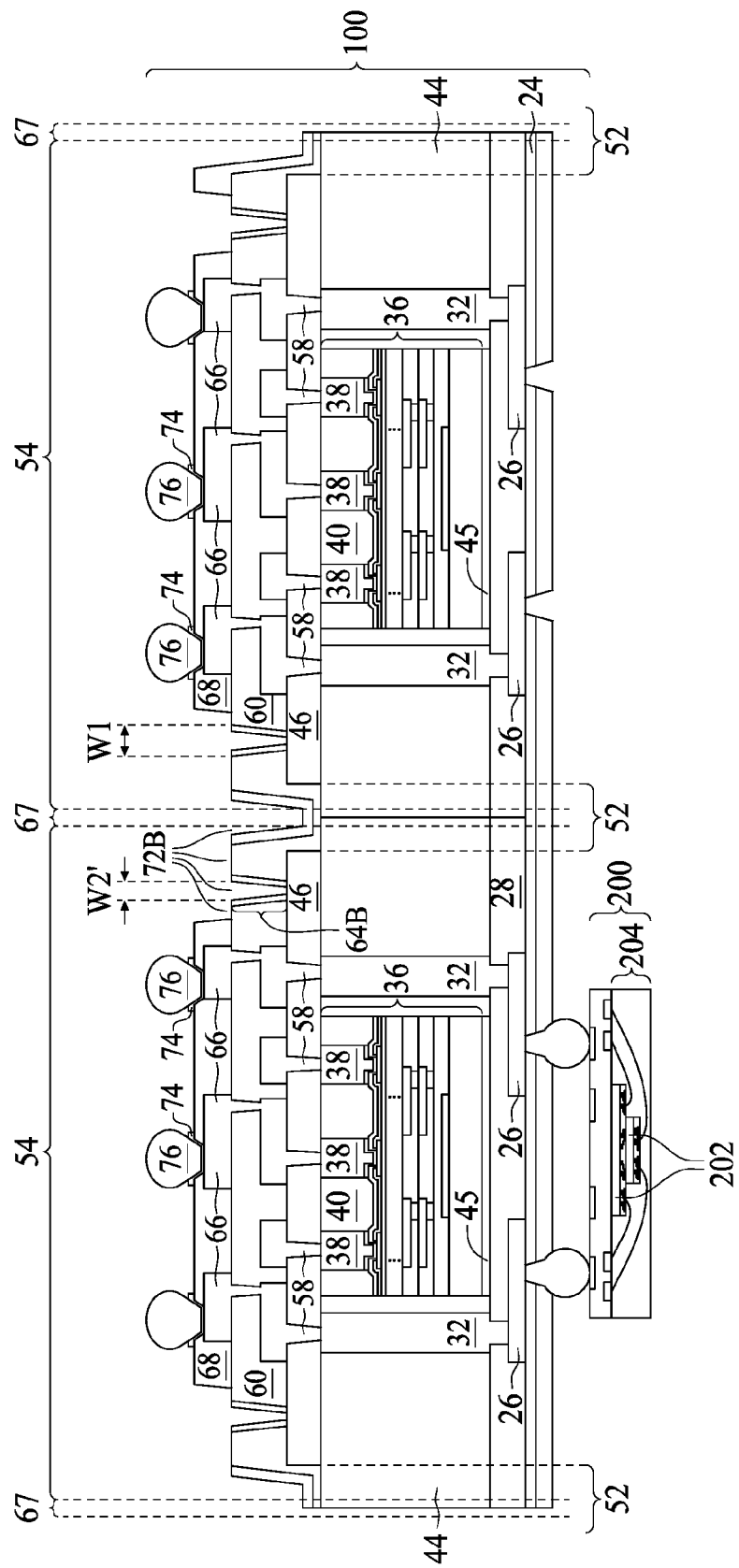

FIG. 20 illustrates the cross-sectional views of package 100 (and packages 54 therein) in accordance with alternative embodiments. In these embodiments, trench ring 64B and trench ring 72B overlap with each other, with the width W2' of trench ring 72B being smaller than width W1 of trench ring 64B. Accordingly, trench ring 72B extends into the portion of polymer layer 68 that extends into trench ring 64B. In addition, trench rings 72B of two packages on the opposite sides of scribe line 52 extend into scribe line 52 and are merged together. As a result, in the final structure after package 100 is sawed apart, trench ring 72B extends to the edges of packages 54.

The embodiments of the present disclosure have some advantageous features. Trench rings are formed in the polymer layers of InFO packages. The trench rings may be used as delamination stoppers in the sawing of packages to prevent the delaimination between polymer layers to propagate into the inner portions of packages. An advantageous feature of the embodiments of the present disclosure is that the formation of trench rings is achieved simultaneously as the formation of openings for UBMs and RDLs, and hence no additional manufacturing cost is involved.

In accordance with some embodiments of the present disclosure, a package includes a device die, a molding material encircling the device die, wherein a top surface of the molding material is substantially level with a top surface of the device die, and a bottom dielectric layer over the device die and the molding material. A plurality of RDLs extends into the bottom dielectric layer and electrically coupling to the device die. A top polymer layer is over the bottom dielectric layer, with a trench ring penetrating through the top polymer layer. The trench ring is adjacent to edges of the package. The package further includes UBMs extending into the top polymer layer.

In accordance with alternative embodiments of the present disclosure, a package includes a device die, and a molding material encircling the device die, wherein a top surface of the molding material is substantially level with a top surface of the device die. A through-via penetrates through the molding material, wherein a top surface of the through-via is substantially coplanar with the top surface of the device die. The package further includes a first polymer layer over and in contact with the device die, the through via, and the molding material. A plurality of RDLs extends into the first polymer layer to electrically couple to the device die and the through-via. A second polymer layer is over the first polymer layer and the plurality of RDLs, wherein a first trench ring extends from a top surface of the second polymer layer to a top surface of the first polymer layer. The package further includes a third polymer layer over and in contact with the second polymer layer, wherein a second trench ring extends from a top surface of the third polymer layer to a top surface of the second polymer layer. UBMs extend into the third polymer layer.

In accordance with yet alternative embodiments of the present disclosure, a method includes molding a plurality of device dies in a molding material, and planarizing the plurality of device dies and the molding material, wherein top surfaces of the device dies are level with a top surface of the molding material. The method further includes forming a first polymer layer over and contacting the plurality of device dies and the molding material, and patterning the first polymer layer to form a first plurality of openings, with metal pillars of the device dies exposed through the first plurality of openings. Scribe lines are formed by the step of patterning the first polymer layer. The method further includes forming a plurality of redistribution lines having via portions penetrating through the first polymer layer, forming a second polymer layer over the first polymer layer, and patterning the second polymer layer to form a second plurality of openings and a first plurality of trench rings, with each of the first plurality of trench rings encircling one of the plurality of device dies. The first plurality of trench rings is separated from each other by the scribe lines. A plurality of UBMs is formed to extend into the second polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a device die;
   an encapsulating material encircling the device die;
   a bottom dielectric layer over and contacting the device die and the encapsulating material;
   a plurality of redistribution lines (RDLs) extending into the bottom dielectric layer and electrically coupling to the device die;
   an intermediate dielectric layer comprising a first portion over the bottom dielectric layer and the plurality of RDLs; and
   a top dielectric layer comprising:
     a first portion over the intermediate dielectric layer; and
     a second portion penetrating through the intermediate dielectric layer and the bottom dielectric layer to contact the encapsulating material.

2. The package of claim 1, wherein the intermediate dielectric layer further comprises a second portion penetrating through the bottom dielectric layer to contact the encapsulating material.

3. The package of claim 2, wherein the second portion of the top dielectric layer is physically spaced apart from the bottom dielectric layer by the second portion of the intermediate dielectric layer.

4. The package of claim 1, wherein the second portion of the top dielectric layer forms a ring encircling a portion of the bottom dielectric layer.

5. The package of claim 1, wherein a top surface of the second portion of the top dielectric layer is lower than a top surface of the intermediate dielectric layer.

6. The package of claim 5, wherein the top surface of the second portion of the top dielectric layer is further lower than a top surface of the bottom dielectric layer.

7. The package of claim 1, wherein the top dielectric layer further comprises a third portion penetrating through the intermediate dielectric layer to contact a top surface of the bottom dielectric layer, wherein the second portion and the third portion of the top dielectric layer are spaced apart from each other by a portion of the intermediate dielectric layer.

8. The package of claim 7, wherein the third portion of the top dielectric layer further forms a ring encircling a portion of the intermediate dielectric layer.

9. The package of claim 8, wherein the third portion of the top dielectric layer is encircled by the second portion of the top dielectric layer.

10. A package comprising:
    a device die;
    a molding compound encircling the device die;
    a first dielectric layer over and in contact with both the device die and the molding compound;
    a plurality of redistribution lines (RDLs) extending into the first dielectric layer to electrically couple to the device die;
    a second dielectric layer having a portion over the first dielectric layer and the plurality of RDLs, wherein a first trench ring extends from a top surface of the second dielectric layer down, and the first trench ring extends to edges of the package; and
    Under-Bump Metallurgies (UBMs) extending into the second dielectric layer.

11. The package of claim 10, wherein the first trench ring fully encircles a portion of the first dielectric layer directly over the device die.

12. The package of claim 10 further comprising a third dielectric layer between the first dielectric layer and the second dielectric layer, wherein the first trench ring penetrates through the third dielectric layer.

13. The package of claim 10, wherein the first trench ring extends below a top surface of the first dielectric layer.

14. The package of claim 10, wherein the first dielectric layer and the second dielectric layer are polymer layers.

15. The package of claim 10 further comprising a second trench ring extending from the top surface of the second dielectric layer to stop on a top surface of the first dielectric layer, wherein the second trench ring is encircled by the first trench ring.

16. A method comprising:
    encapsulating a first device die and a second device die in an encapsulating material;
    forming a first dielectric layer over and contacting the first device die, the second device die, and the encapsulating material;

patterning the first dielectric layer to form a first opening, a second opening, and a first trench, with a first metal pillar in the first device die and a second metal pillar in the second device die exposed to the first opening and the second opening, respectively, and the encapsulating material exposed to the first trench;

forming a first redistribution line and a second redistribution line extending into the first opening and the second opening to contact the first metal pillar and the second metal pillar, respectively;

forming a second dielectric layer comprising a first portion over and contacting the first dielectric layer, and a second portion in the first trench; and patterning the second dielectric layer to form a third opening, a fourth opening and a second trench, with the first redistribution line and the second redistribution line exposed to the third opening and the fourth opening, respectively, wherein after the second dielectric layer is patterned, the encapsulating material is exposed to the second trench.

17. The method of claim 16 further comprising performing a singulation to separate the first device die and the second device die into a first package and a second package, respectively, wherein the first trench and the second trench are separated into the first package and the second package, respectively.

18. The method of claim 16, wherein the first trench is formed as a trench ring.

19. The method of claim 16, wherein the second dielectric layer comprises a bottom surface contacting a top surface of the encapsulating material.

20. The method of claim 16, wherein the first dielectric layer and the second dielectric layer are polymer layers.

* * * * *